United States Patent
Yamamoto et al.

(10) Patent No.: US 11,050,306 B2
(45) Date of Patent: Jun. 29, 2021

(54) POWER EFFICIENCY MEASURING APPARATUS

(71) Applicant: HIOKI E.E. CORPORATION, Nagano (JP)

(72) Inventors: Yuki Yamamoto, Nagano (JP); Natsuki Miyashita, Nagano (JP); Tomohide Tsukasaki, Nagano (JP)

(73) Assignee: HIOKI E.E. CORPORATION, Nagano (JP)

( * ) Notice: Subject to any disclaimer, the term of this patent is extended or adjusted under 35 U.S.C. 154(b) by 126 days.

(21) Appl. No.: 16/418,245

(22) Filed: May 21, 2019

(65) Prior Publication Data

US 2020/0006990 A1 Jan. 2, 2020

(30) Foreign Application Priority Data

Jun. 28, 2018 (JP) .............................. JP2018-122580

(51) Int. Cl.
| | |
|---|---|
| *H02J 50/90* | (2016.01) |
| *G01D 9/08* | (2006.01) |
| *H02J 50/05* | (2016.01) |
| *G01R 29/08* | (2006.01) |
| *B60L 53/10* | (2019.01) |

(52) U.S. Cl.
CPC ............... *H02J 50/90* (2016.02); *G01D 9/08* (2013.01); *G01R 29/0807* (2013.01); *H02J 50/05* (2016.02); *B60L 53/10* (2019.02)

(58) Field of Classification Search
CPC ............ H02J 50/90; H02J 50/05; H02J 50/10; G01D 9/08; G01R 29/0807; G01R 31/42; G01R 21/00; B60L 53/10
See application file for complete search history.

(56) References Cited

U.S. PATENT DOCUMENTS

| | | | | |
|---|---|---|---|---|
| 2004/0182721 | A1* | 9/2004 | Manens | B24B 49/04 205/645 |
| 2007/0052977 | A1* | 3/2007 | Wang | G01N 21/55 356/630 |

(Continued)

FOREIGN PATENT DOCUMENTS

JP 2018-004285 1/2018

OTHER PUBLICATIONS

Translation of Japanese reference (Year: 2019).*

*Primary Examiner* — Christopher P McAndrew
*Assistant Examiner* — Zannatul Ferdous
(74) *Attorney, Agent, or Firm* — Greenblum & Bernstein, P.L.C.

(57) ABSTRACT

A measuring apparatus enables accurate evaluation of a noncontact power supply. The measuring apparatus includes a mover that moves at least one of supplier and receiver electrodes of the noncontact power supply to measurement positions decided in advance, a meter that measures a measurement of the noncontact power supply at each measurement position, and a processor that calculates the power supplying efficiency of the noncontact power supply at each measurement position based on a measured value of the measurement. The processor specifies a region area of a region on the plane on which the electrodes move where the power supplying efficiency is within a designated range that has been designated in advance and generates area data indicating the region area.

17 Claims, 11 Drawing Sheets

(56) References Cited

U.S. PATENT DOCUMENTS

| | | | | |
|---|---|---|---|---|
| 2010/0151344 | A1* | 6/2010 | Otomaru | H01M 8/2418 |
| | | | | 429/444 |
| 2010/0176596 | A1* | 7/2010 | Peralta | F03B 13/14 |
| | | | | 290/53 |
| 2014/0306388 | A1* | 10/2014 | May | B60G 11/27 |
| | | | | 267/64.27 |
| 2014/0361633 | A1* | 12/2014 | Abe | H02J 50/40 |
| | | | | 307/104 |
| 2016/0254511 | A1* | 9/2016 | Hatta | H01M 50/449 |
| | | | | 307/10.1 |
| 2016/0313445 | A1* | 10/2016 | Bailey | G01S 7/4816 |
| 2019/0329353 | A1* | 10/2019 | Dai | B23K 26/26 |

* cited by examiner

*F I G . 4*

| | START POSITION | END POSITION | MOVEMENT INTERVAL |
|---|---|---|---|
| X COORDINATE | 10 mm | 100 mm | 10 mm |
| Y COORDINATE | 10 mm | 100 mm | 10 mm |
| Z COORDINATE | 10 mm | 100 mm | 10 mm |

| | START ANGLE | END ANGLE | ROTATIONAL INTERVAL |
|---|---|---|---|
| θ DIRECTION | — ° | — ° | — ° |

Gs

7

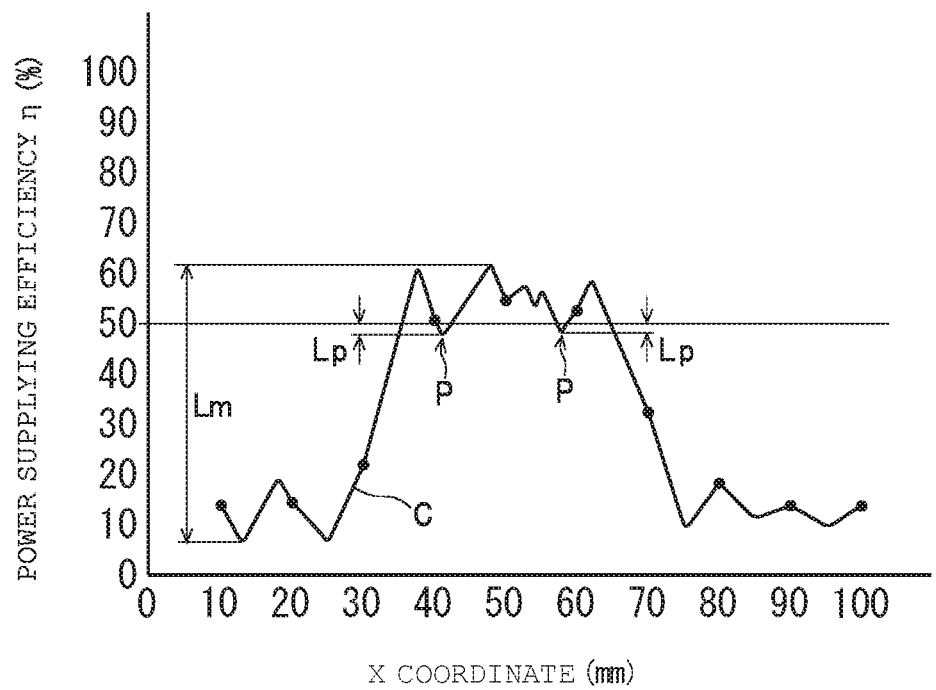
F I G. 1 3

POWER EFFICIENCY MEASURING APPARATUS

FIELD OF THE INVENTION

The present invention relates to a measuring apparatus that calculates the power supplying efficiency of a noncontact power supply based on the measured values of measurements obtained for the noncontact power supply.

DESCRIPTION OF THE RELATED ART

As one example of a measuring apparatus of this type, the measuring apparatus disclosed by the present applicant in Patent Literature 1 (Japanese Laid-open Patent Publication No. 2018-4285) is known. This measuring apparatus is configured to measure the supplied power and received power of a noncontact power supply, to specify the power supplying efficiency of the noncontact power supply based on the measured values of the supplied power and received power, and to display information relating to the power supplying efficiency which is to be used when evaluating the noncontact power supply. In the described configuration, as information relating to the power supplying efficiency, the measuring apparatus displays an image in which regions with high power supplying efficiency and regions with low power supplying efficiency on the same plane are indicated using different display formats. This means that the measuring apparatus enables users to easily distinguish between regions with high and low power supplying efficiency on the same plane.

SUMMARY OF THE INVENTION

However, the measuring apparatus described above has the following problem to be solved. As the information on power supplying efficiency used to evaluate a noncontact power supply, the measuring apparatus displays an image in which regions with high and low power supplying efficiency on the same plane are displayed with different display formats, which makes it possible to easily distinguish between the regions with low and high power supplying efficiency on the same plane. However, when evaluating noncontact power supplies, there are also cases where a noncontact power supply is evaluated based on the area of the region with high power supplying efficiency. If the area of the region where the power supplying efficiency is high is wider, it will be possible to supply power with a high power supplying efficiency even in a state where the power supplying electrodes of the noncontact power supply and the receiver electrodes do not directly face each other. For this reason, as one example, it is possible to designate a lower limit value for the power supplying efficiency that is required by a noncontact power supply, to specify the area of a region with the designated power supplying efficiency or higher, and to evaluate the noncontact power supply as being more superior the larger the area of this region. With the measuring apparatus described above, although it is possible to easily distinguish between the regions with high and low power supplying efficiency, there is no function for generating information that makes it possible to identify the specific area of the region with high power supplying efficiency, which makes it difficult to accurately evaluate a noncontact power feeding device based on this area. Accordingly, there is demand for a measuring apparatus capable of doing this.

The present invention was conceived in view of the problem described above to be solved and has a principal object of providing a measuring apparatus capable of accurately evaluating a noncontact power supply.

To achieve the stated object, a measuring apparatus according to the present invention comprises:

a mover that moves at least one of a supplier electrode and a receiver electrode of a noncontact power supply to measurement positions that have been decided in advance;

a meter that measures a measurement for the noncontact power supply at each measurement position; and a processor that calculates a power supplying efficiency of the noncontact power supply at each measurement position based on measured values of the measurement, wherein the processor specifies, on a plane where the at least one of the supplier electrode and the receiver electrode moves, a region area of a region where the power supplying efficiency is in a designated range that has been designated in advance, and generates area information indicating the region area.

In this way, the measuring apparatus according to the present invention specifies the region area of a region on a plane on which the electrode moves where the power supplying efficiency is within the designated range, and generates the area information indicating the region area. This means that according to the measuring apparatus, as one example, by designating a designated range that has the minimum power supplying efficiency required for a noncontact power supply as a lower limit value and generating area information indicating the region area within the designated range that has been designated, it is possible to determine, based on the area information, whether the region area required for the noncontact power supply is large or small, and by doing so, to accurately evaluate the noncontact power supply.

Also, with the measuring apparatus according to the present invention, the processor treats the plane as a first plane orthogonal coordinate system, designates one coordinate value out of two position coordinates in the first plane orthogonal coordinate system as a designated coordinate value, defines a second plane orthogonal coordinate system that has another coordinate value out of the two position coordinates as a first coordinate and has the power supplying efficiency as a second coordinate, plots, in the second plane orthogonal coordinate system, coordinate points that are each defined by a coordinate value of the other position coordinate of a measurement position where the one coordinate value out of the two position coordinates is the designated coordinate value and the power supplying efficiency of the measurement position, specifies a curve indicating a relationship between the other position coordinate and the power supplying efficiency based on the coordinate points, executes, while changing the designated coordinate value, a specifying process that specifies an extending length, along an axis of the first coordinates, of the curve that belongs inside the designated range, and specifies the region area based on the extending lengths specified by the specifying process.

Thus, with the measuring apparatus according to the present invention, the coordinate value of one of the position coordinates in the first plane orthogonal coordinate system is designated as the designated coordinate value, coordinate points defined by a coordinate value of the other position coordinate of measurement positions where the coordinate value of one of the position coordinates is the designated coordinate value and the power supplying efficiency at that measurement position are plotted in a second plane orthogonal coordinate system that has the other position coordinate as the first coordinate and has the power supplying efficiency as the second coordinate, a curve indicating the relationship between the other position coordinate and the power supplying efficiency is specified based on these coordinate points, and a specifying process that specifies the extending length along the first coordinate axis of the curve belonging inside the designated range is executed while changing the designated coordinate value. By specifying the region area based on the extending lengths specified by the respective specifying processes, it is possible to accurately specify the region area using simple processing.

With the measuring apparatus according to the present invention, the processor executes, for every combination of two designated coordinate values, a calculation process that calculates an area of a trapezoid having two segments, which pass through two adjacent designated coordinate values in the first plane orthogonal coordinate system, are parallel to an axis of the other position coordinate, and have the respective extending lengths at the designated coordinate values, as upper and lower edges and a distance between the two designated coordinate values as a height and calculates, when the extending length of one out of the two adjacent designated coordinate values is zero, an area of a triangle that has a segment, which passes through the other designated coordinate value, is parallel to an axis of the other position coordinate, and has the extending length at the other designated coordinate value, as a base and a distance between the two adjacent designated coordinate values as a height, and adds the areas calculated in the calculation process to specify the region area.

Thus, with the measuring apparatus according to the present invention, a calculation process which calculates, for every combination of two designated coordinate values, the area of a trapezoid having two segments, which pass through two adjacent designated coordinate values in the first plane orthogonal coordinate system, are parallel to the axis of the other posit ion coordinate, and have the extending lengths at the respective designated coordinate values, as the upper and lower edges and the distance between the two designated coordinate values as the height and calculates, when the extending length of one out of the two adjacent designated coordinate values is zero, the area of a triangle that has a segment, which passes through the other designated coordinate value, is parallel to the axis of the other position coordinate, and has the extending length at the other designated coordinate value, as the base and the distance between the two adjacent designated coordinate values as the height, and then adds the areas calculated by the calculation process to specify the region area. Compared to an example method that specifies the region area by executing, for every segment, a process that calculates the area of rectangles that have the segments described above as the long sides and the segments of a distance between two adjacent designated coordinate values as the short sides and adds the areas of the respective rectangles, it is possible to specify the region area more accurately.

Also, with the measuring apparatus according to the present invention, the processor specifies the curve based on the coordinate points using approximation or interpolation and specifies the extending length in the specifying process by regarding, when a protrusion that protrudes downward from the designated range below a lower limit value of the designated range is present on the curve and a protruding amount of the protrusion is within a range set in advance, the protrusion as belonging within the designated range.

Thus, with the measuring apparatus according to the present invention, when a protrusion that protrudes downward from the designated range below the lower limit value of the designated range is present on a curve that has been specified by approximation or interpolation based on the coordinate points, if the protruding amount of the protrusion is within a range that has been set in advance, the extending length is specified by regarding the protrusion as belonging within the designated range. This means that according to the measuring apparatus, it is possible to reliably avoid a situation where the region area is specified as being smaller than the actual area due to a protrusion of the curve that has a high probability of having been produced when the curve was specified using an approximation formula or an interpolation formula being treated as being outside the designated range. As a result, it is possible to specify the region area even more accurately.

Also, with the measuring apparatus according the present invention, the processor specifies a region area for each of a plurality of different designated ranges and generates information indicating each region area as the area information.

Thus, with the measuring apparatus according to the present invention, since it is possible, by specifying the region area for each of a plurality of different designated ranges and generating area information indicating the region areas, to display a graph indicating how the region area changes according to changes in the designated range based on the area information, it is possible to grasp the region area for each of a plurality of designated ranges at a glance. This means that it is possible to significantly improve usability when evaluating a noncontact power supply.

Also, with the measuring apparatus according to the present invention, the processor specifies region areas on a plurality of planes that are respectively parallel and generates information indicating each region area as the area information.

Thus, with the measuring apparatus according to the present invention, by specifying region areas on a plurality of planes that are respectively parallel and by generating information that indicates each region area as the area information, it is possible to grasp changes in the region area caused by changes in the separation distance between the supplier electrode and the receiver electrode. Therefore, according to the measuring apparatus, it is possible to evaluate the noncontact power supply from multiple viewpoints.

Also, the measuring apparatus according to the present invention further comprises a display and a display controller that displays, based on the area information, an image indicating the region area on the display.

Thus, the measuring apparatus according to the present invention is equipped with the display and the display controller displays the image indicating the region area on the display based on the area information. Unlike a configuration that is not equipped with the display and displays the image indicating the region area on an external display, a task of connecting the measuring apparatus to the external display is unnecessary, which improves the efficiency of the task of evaluating a noncontact power supply based on the image indicating the region area.

It should be noted that the disclosure of the present invention relates to the contents of Japanese Patent Application No. 2018-122580 that was filed on Jun. 28, 2013, the entire contents of which are herein incorporated by reference.

BRIEF DESCRIPTION OF THE DRAWINGS

These and other objects and features of the present invention will be explained in more detail below with reference to the attached drawings, wherein:

FIG. 4 is a display screen of a measurement condition setting image;

FIG. 13 is a fifth diagram useful in explaining the area information generating process.

DESCRIPTION OF THE PREFERRED EMBODIMENTS

Preferred embodiments of a measuring apparatus will now be described with reference to the attached drawings.

Figure 1:
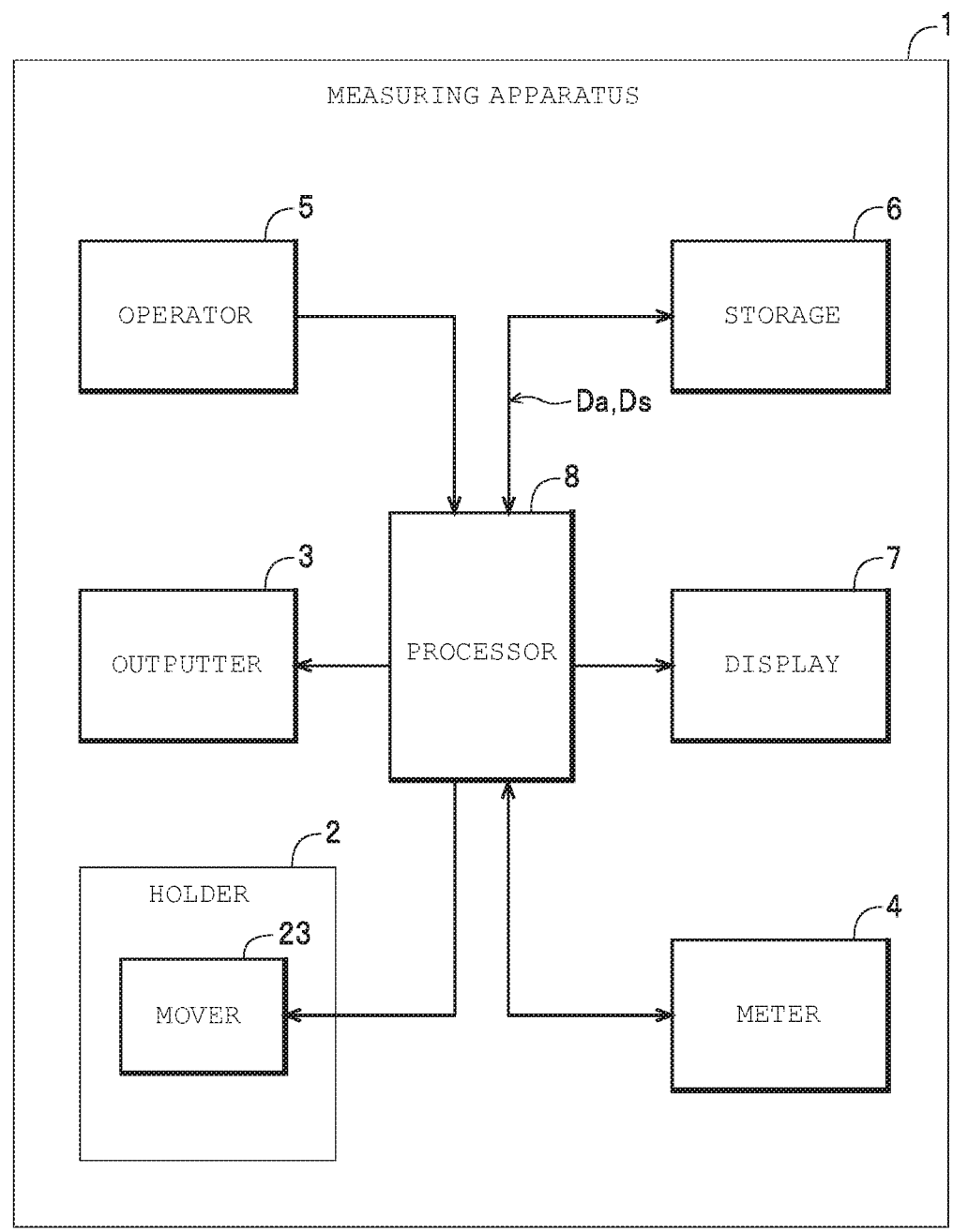
FIG. 1 is a block diagram depicting the configuration of a measuring apparatus.

First, the configuration of a measuring apparatus 1 depicted in FIG. 1 will be described as one example of a measuring apparatus according to the present invention. As depicted in FIG. 1, the measuring apparatus 1 includes a holder 2, an outputter 3, a meter 4, an operator 5, storage 6, a display 7, and a processor 8. The measuring apparatus 1 measures a measurement (here, as described later, received power) for an noncontact power supply (or "wireless power supply"), calculates the power supplying efficiency η of the noncontact power supply based on a measured value of received power (that is, received power as a proportion of supplied power), generates area data Da indicating area information for the region area of a region where the power supplying efficiency η is within a designated range (which has been designated in advance), and displays an area information image Gi indicating this region area (see FIG. 5). It should be noted that with this noncontact power supply, power is supplied from the supplier side to the receiver side by noncontact power supply using one of an electromagnetic induction, an electromagnetic resonant coupling, and an electrically resonant coupling.

Figure 2:
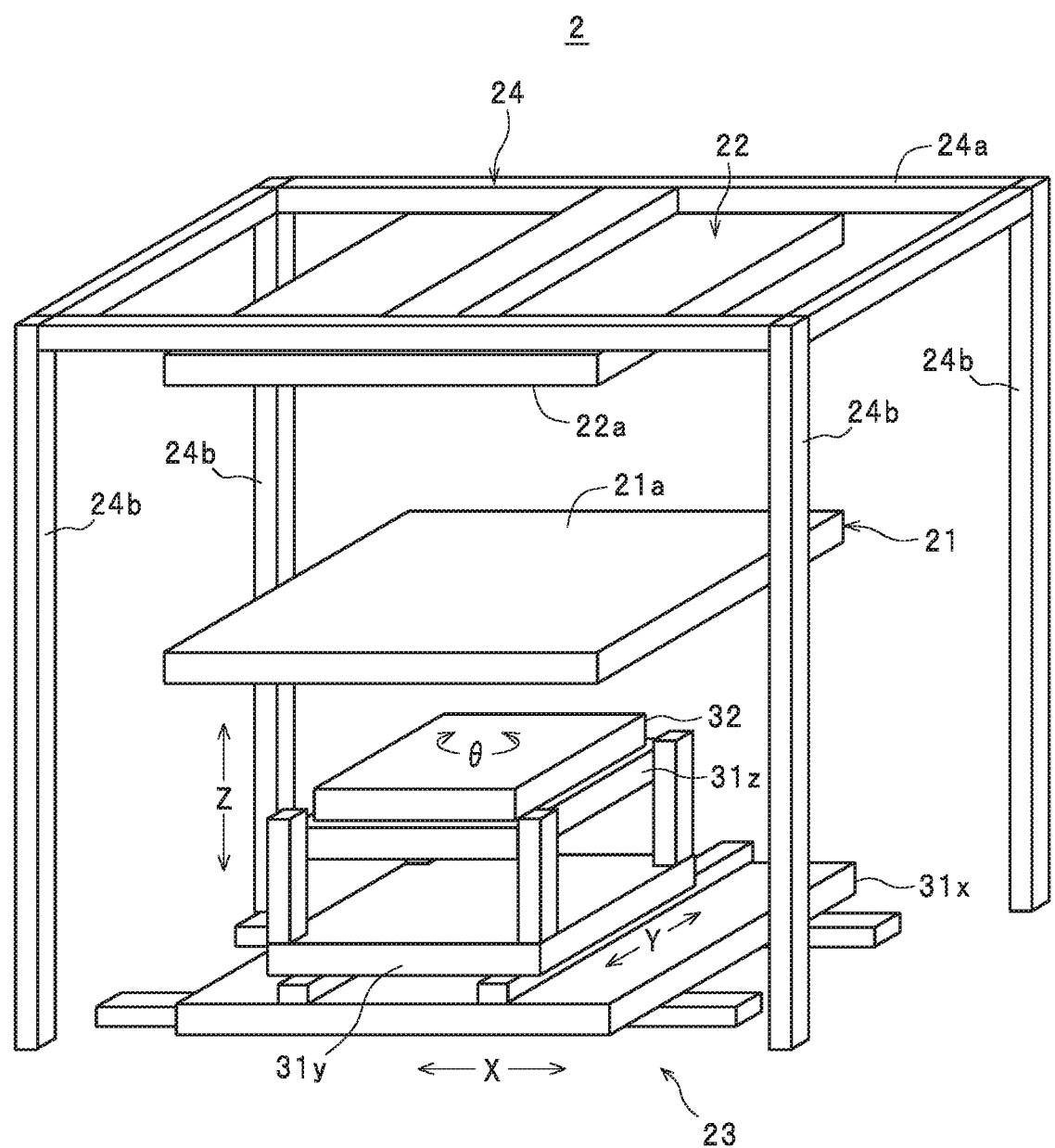
FIG. 2 is a perspective view of a holder.
Figure 3:
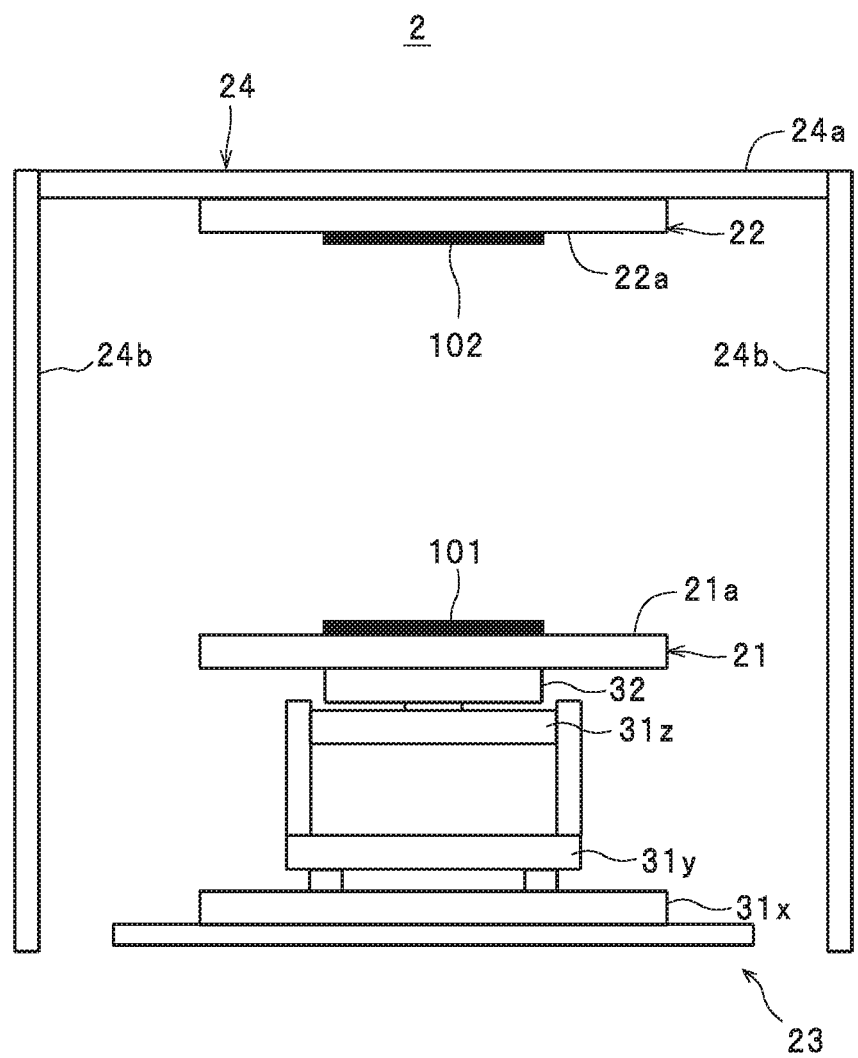
FIG. 3 is a front view of the holder.

As depicted in FIGS. 2 and 3, the holder 2 includes a supplier-side holder 21, a receiver-side holder 22, a mover 23, and a frame 24.

As depicted in FIGS. 2 and 3, the supplier-side holder 21 includes a table 21a on which a supplier-side electrode 101 of the noncontact power supply can be placed and, as necessary, a fixture, not illustrated, that fixes the supplier-side electrode 101 placed on the table 21a, and is configured so as to be capable of holding the supplier-side electrode 101. The supplier-side holder 21 (table 21a) is fixed on a revolving table 32, described later, of the mover 23, and is moved by the mover 23. Note that in FIG. 2, a state where the supplier-side holder 21 has been upwardly separated from the revolving table 32 is illustrated.

As depicted in FIGS. 2 and 3, the receiver-side holder 22 includes a board 22a, on whose lower surface a receiver-side electrode 102 of the noncontact power supply is disposed (hereinafter, the supplier-side electrode 101 and the receiver-side electrode 102 are collectively referred to as the "electrodes 101 and 102") and, as necessary, a fixture, not illustrated, that fixes the receiver-side electrode 102 disposed on the board 22a, and is configured so as to be capable of holding the receiver-side electrode 102. The receiver-side holder 22 is fixed to the frame 24.

As depicted in FIG. 2, the mover 23 includes three moving tables 31x, 31y, and 31z that are capable of moving in the direction, the Y direction, and the Z direction, respectively (hereinafter collectively referred to as the "moving tables 31" when no distinction is made), and the revolving table 32 to which the supplier-side holder 21 is fixed and which is capable of moving (rotating) in the θ direction. In accordance with control by the processor 8, the mover 23 moves the supplier-side holder 21 the X and Y directions depicted in FIG. 2 (that is, movement on a single plane) to change the measurement position of the supplier-side electrode 101 (which is the relative measurement position of the electrodes 101 and 102) along the X and Y directions. The mover 23 also moves the supplier-side holder 21 in the Z direction depicted in FIG. 2 (that is, movement in a direction perpendicular to the single plane) to change the measurement position of the supplier-side electrode 101 (which is the relative measurement position of the electrodes 101 and 102) along the Z direction. Also, in accordance with control by the processor 8, the mover 23 rotates the supplier-side holder 21 in the θ direction depicted in FIG. 2 (that is, a rotational direction about an axis in the Z direction) change the posture of the supplier-side electrode 101 relative to the receiver-side electrode 102. As depicted in FIGS. 2 and 3 for example, the frame 24 includes a fixing frame 24a (which is formed in a rectangular shape when viewed from above in the present embodiment) that fixes the receiver-side holder 22 (specifically, the board 22a) and a support leg 24b (which is formed of four members in the present embodiment for example) that supports the fixing frame 24a substantially parallel to the table 21a above the table 21a. With this configuration, the board 22a of the receiver-side holder 22 is disposed above the table 21a, facing the table 21a, and substantially parallel to the table 21a, by being fixed on the lower surface of the fixing frame 24a.

In accordance with control by the processor 8, the outputter 3 outputs power to be supplied via the supplier-side electrode 101.

In accordance with control by the processor 8, when power (the "supplied power") is being supplied via the supplier-side electrode 101, the meter 4 measures the supplied power being supplied and the received power received by the receiver-side electrode 102 as measurements.

The operator 5 includes a keyboard and/or pointing device, not illustrated, and is configured so as to be capable of performing operations such as an instruction operation for the start of measurement and/or an instruction operation for the end of measurement, a setting operation that sets the movement range or rotation angle for the supplier-side electrode 101 moved by the holder 2, and a setting operation that sets the type of area information and the like to be included in the area information image Gi to be displayed on the display 7.

In accordance with control by the processor 8, the storage 6 stores setting value data Ds indicating setting values that have been set via the operator 5. In accordance with control by the processor 8, the storage 6 also stores measured values of the supplied power and the received power measured by the meter 4. In accordance with control by the processor 8, the storage 6 also stores the area data Da generated by the processor 8.

Figure 5:
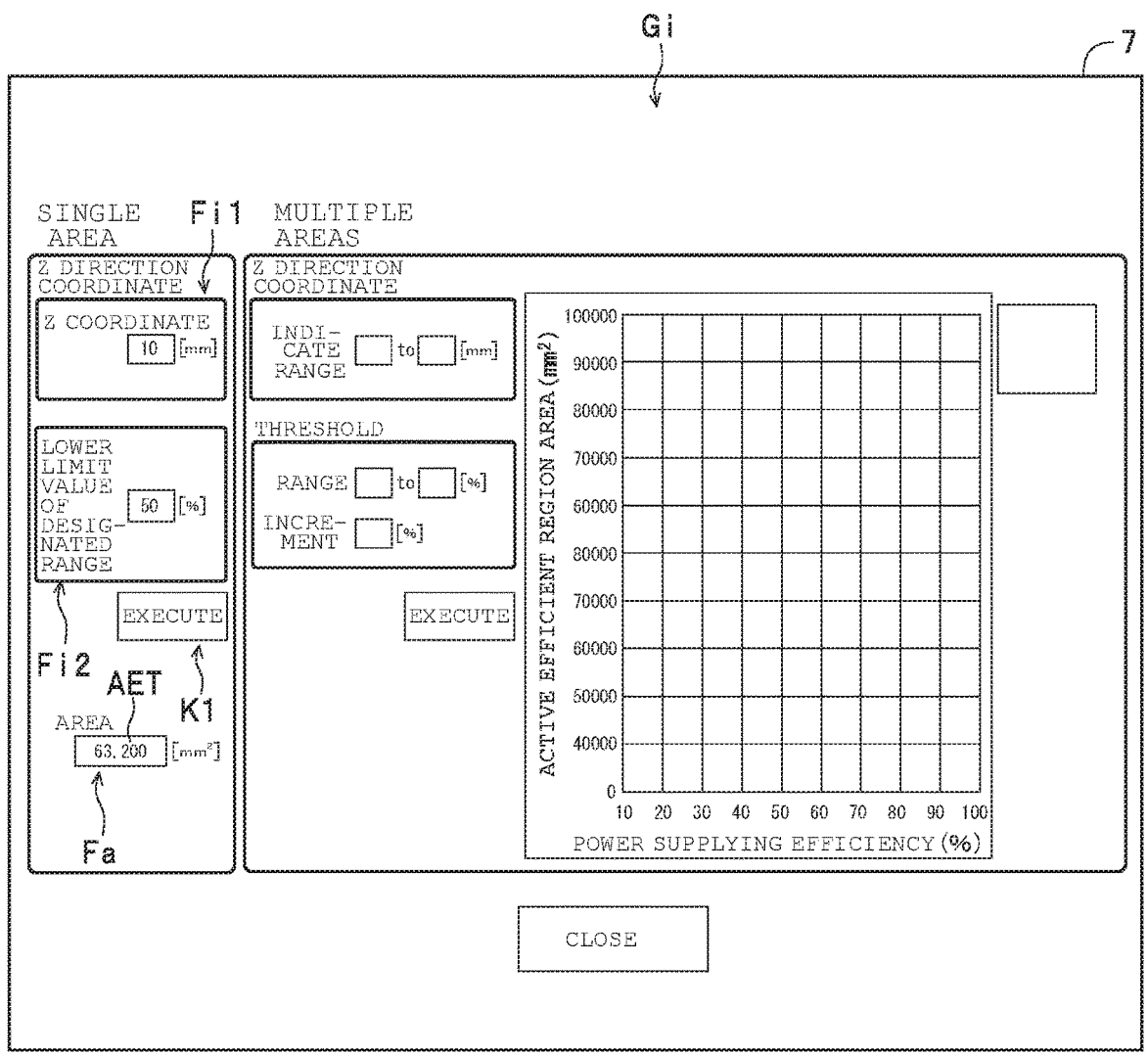
FIG. 5 is a display screen of an area information image.
Figure 11:
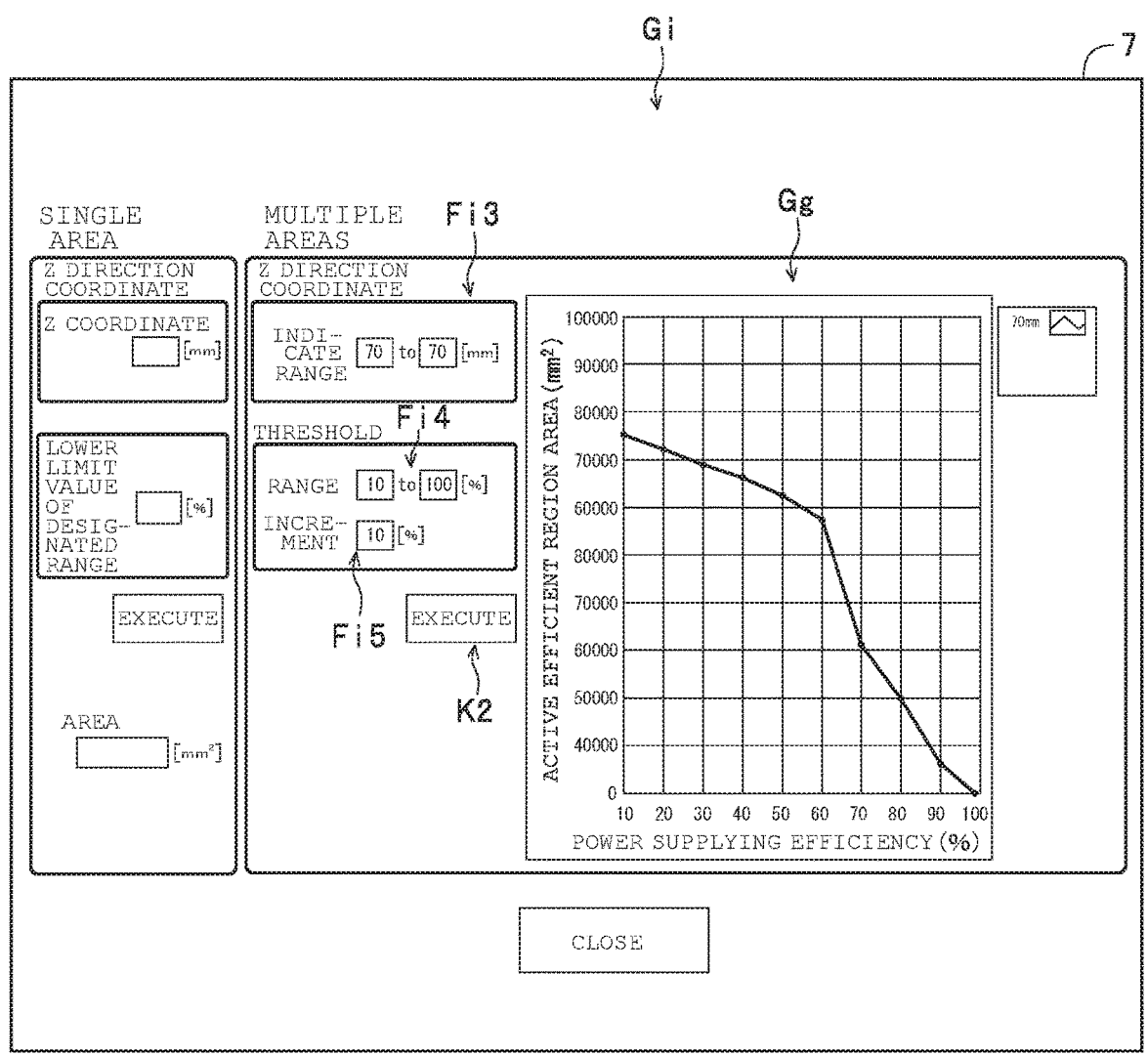
FIG. 11 is a first display screen of an area information image including an area graph.
Figure 12:
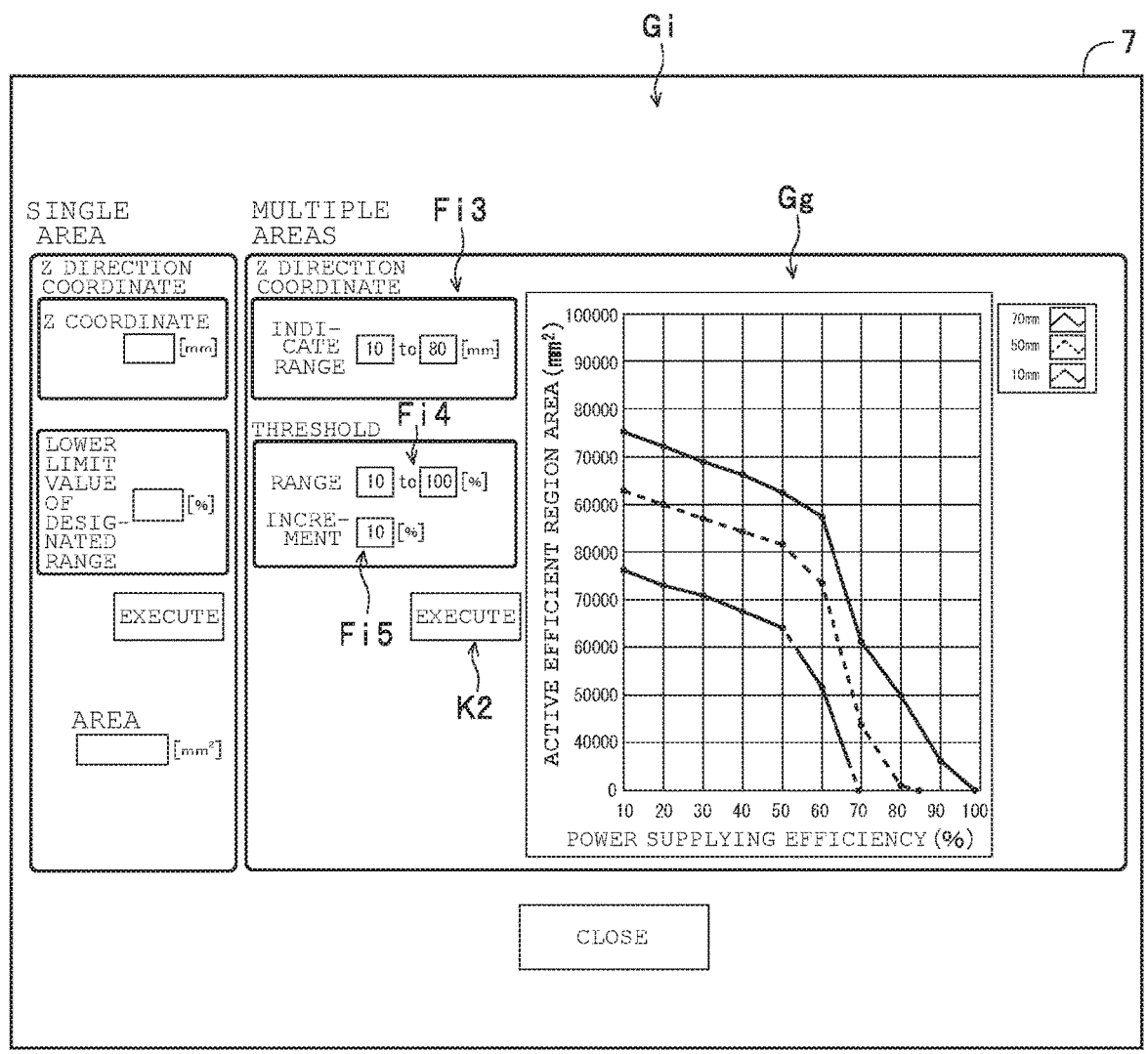
FIG. 12 is a second display screen of an area information image including an area graph.

In accordance with control by the processor 8, the display 7 displays various images, such as a measurement condition setting image Gs depicted in FIG. 4 and the area information images Gi depicted in FIGS. 5, 11, and 12.

Figure 6:
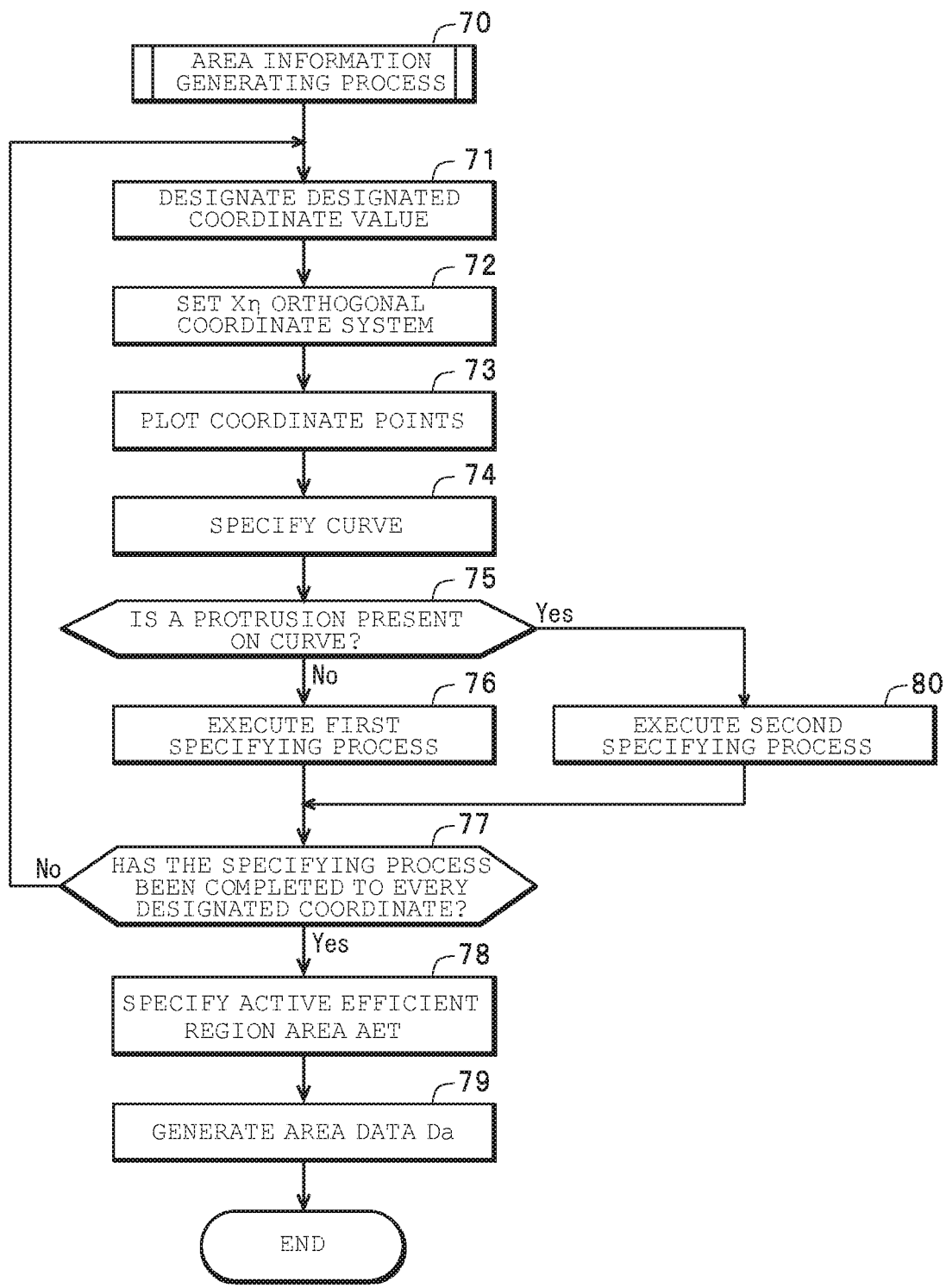
FIG. 6 is a flowchart of an area information generating process.

The processor 8 controls the various component elements that construct the measuring apparatus 1 in accordance with operation signals outputted from the operator 5 and executes various processing. In more detail, the processor 8 controls movement and rotation of the supplier-side holder 21 by the mover 23. The processor 8 controls the meter 4 to measure the supplied power and received power as measurements. The processor 8 also specifies the power supplying efficiency η of the noncontact power supply (that is, the received power as a proportion of the supplied power) based on the received power measured by the meter 4 and the supplied power supplied via the supplier-side electrode 101 when the received power was measured. The processor 8 also executes an area information generating process 70 (see FIG. 6), described later to generate area data Da for area information indicating the region area of a region (this area is hereinafter referred to as the "active efficient region area AET") where the power supplying efficiency η is within a range designated in advance (or "designated range") on a plane that has been designated as the plane on which the supplier-side electrode 101 moves (that is, a plane that is parallel with the X and Y directions, hereinafter also referred to as the "designated plane"). The processor 8 also functions as a display controller and executes a display process that displays various images, such as a measurement condition setting image Gs (see FIG. 4) and an area information image Gi (see FIGS. 5, 11, and 12) on the display 7.

Next, the method of using the measuring apparatus 1 will be described with reference to the drawings.

As one example, the measuring apparatus 1 can be used when measuring measurements for a noncontact power supply used to charge the battery of an electrical appliance and evaluating the noncontact power supply. When the measuring apparatus 1 is used in this way, first, as depicted in FIG. 3, the supplier-side electrode 101 of the noncontact power supply to be evaluated is placed on the supplier-side holder 21 of the holder 2 and is fixed using a fixture, not illustrated, to hold the supplier-side electrode 101 on the supplier-side holder 21. After this, by fixing the receiver-side electrode 102 of the noncontact power supply to the lower surface of the receiver-side holder 22 using a fixture, not illustrated, the receiver-side electrode 102 is held on the receiver-side holder 22.

After this, the operator 5 is operated to make various settings. First, the supplied power and the received power are designated as the measurements to be measured by the measuring apparatus 1. With the measuring apparatus 1, when measuring supplied power and received power, it is possible to designate movement ranges in the X, Y, and Z directions and movement intervals for the respective directions, to designate the range of rotation and the rotational interval (that is, the interval for the angle of rotation) in the θ direction, and while automatically changing the measurement position and posture of the supplier-side electrode 101 relative to the receiver-side electrode 102 by moving the supplier-side electrode 101 according to the designated movement ranges and movement intervals and rotating the supplier-side electrode 101 by the designated range of rotation and the rotational interval, to continuously measure the power supplying efficiency η at each measurement position and posture.

To have such continuous measurement executed, the operator 5 is operated to indicate the displaying of the measurement condition setting image Gs depicted in FIG. 4. In response to this, the processor 8 executes the display process to display the measurement condition setting image Gs on the display 7. After this, desired values are inputted into the various frames in the measurement condition setting image Gs to set the movement range, amount of rotation, and the like of the supplier-side holder 21 (that is, the supplier-side electrode 101). As depicted in FIG. 4, the XYZ coordinates (for example, 10 mm) of the movement start position in the X, Y, and Z directions and the XYZ coordinates (for example, 100 mm) of the movement end position are inputted to set the movement ranges in the X, Y, and Z directions and the movement intervals (for example, 10 mm) are also inputted. Also, when the supplier-side electrode 101 is to be rotated in the θ direction, the start angle of the rotation and the end angle of the rotation are inputted to set the range of rotation and the rotational interval is also inputted. Note that in this example, it is assumed that the posture of the supplier-side electrode 101 relative to the receiver-side electrode 102 is kept constant and the supplier-side electrode 101 is moved in only the X, Y, and Z directions. For this reason, the input frames for the rotation start angle and end angle and also the rotational interval in the movement condition input screen are blank. After this, when the settings have been completed, the processor 8 stores the setting value data Ds indicating the inputted setting values in the storage 6.

Next, the operator 5 is operated to indicate the start of measurement. In response to this, the processor 8 controls the outputter 3 to start outputting power. The processor 8 then reads the setting value data Ds from the storage 6 and specifies the first measurement position (or "movement start position") based on the setting value data Ds. After this, the processor 8 controls the mover 23 of the holder 2 to move the supplier-side holder 21 so that the supplier-side electrode 101 supported on the supplier-side holder 21 becomes positioned at the first measurement position.

Next, the processor 8 controls the meter 4 to measure the supplied power supplied from the supplier-side electrode 101 and the received power received by the receiver-side electrode 102. The processor 8 also stores the measured values of the measured supplied power and the received power in the storage 6. The processor 8 then specifies the next measurement position based on the setting value data Ds and controls the mover 23 to move the supplier-side holder 21 so that the supplier-side electrode 101 becomes positioned at the next measurement position. After this, the processor 8 controls the meter 4 to measure the supplied power and the received power and stores the measured values that have been produced in the storage 6.

The processor 8 controls the mover 23 and the meter 4 to successively change the measurement positions of the supplier-side holder 21 (the supplier-side electrode 101) at the set movement intervals within the set movement range, has the supplied power and the received power measured at each measurement position, and stores the produced measured values in the storage 6. Here, as the method of changing the measurement position, it is possible to use a method that sets a measurement position that is closest in any of the X, Y, and Z directions to the measurement position for which measurement has been completed as the next measurement position, and to use a method that performs a process that changes the measurement position to every position in the X and Y directions in a state where the coordinate in the Z direction is fixed while successively changing the coordinate in the Z direction.

After this, when measurement of the supplied power and the received power at every position specified based on the setting value data Ds has been completed, the processor 8 displays a message indicating that measurement is complete on the display 7. Next, the operator 5 is operated to perform an instruction operation for the end of measurement. In response to this, the processor 8 controls the outputter 3 to stop the outputting of power.

The measuring apparatus 1 is also capable of generating the area data Da indicating area information to be used when evaluating the performance of the noncontact power supply and displaying an area information image Gi (see FIG. 5), which indicates the area information, on the display 7. The area information includes information indicating the active efficient region area AET of the region, on a designated plane that is parallel to the X and Y directions and on which the supplier-side electrode 101 moves, where the power supplying efficiency η is within a designated range that has been designated in advance.

To have the area data Da described above generated and the area information image Gi displayed, the operator 5 is operated to indicate displaying of the area information image Gi. In response to this, the processor 8 executes the display process to display the area information image Gi on the display 7 as depicted in FIG. 5. After this, the type and conditions (or "designated range") of the area information to be included in the area information image Gi are inputted. Here, as one example, to include an active efficient region area AET with a power supplying efficiency η of at least 50% (the condition for belonging inside the designated range) on a designated plane where the Z direction coordinate is 10 mm in the area information image Gi as the area information, as depicted in FIG. 5, "10 mm" and "50%" are inputted into the setting value input frames Fi1 and Fi2 in the area information image Gi and then the EXECUTE key K1 is operated. In response to this, the processor 8 executes the area information generating process 70 (see FIG. 6).

Figure 7:
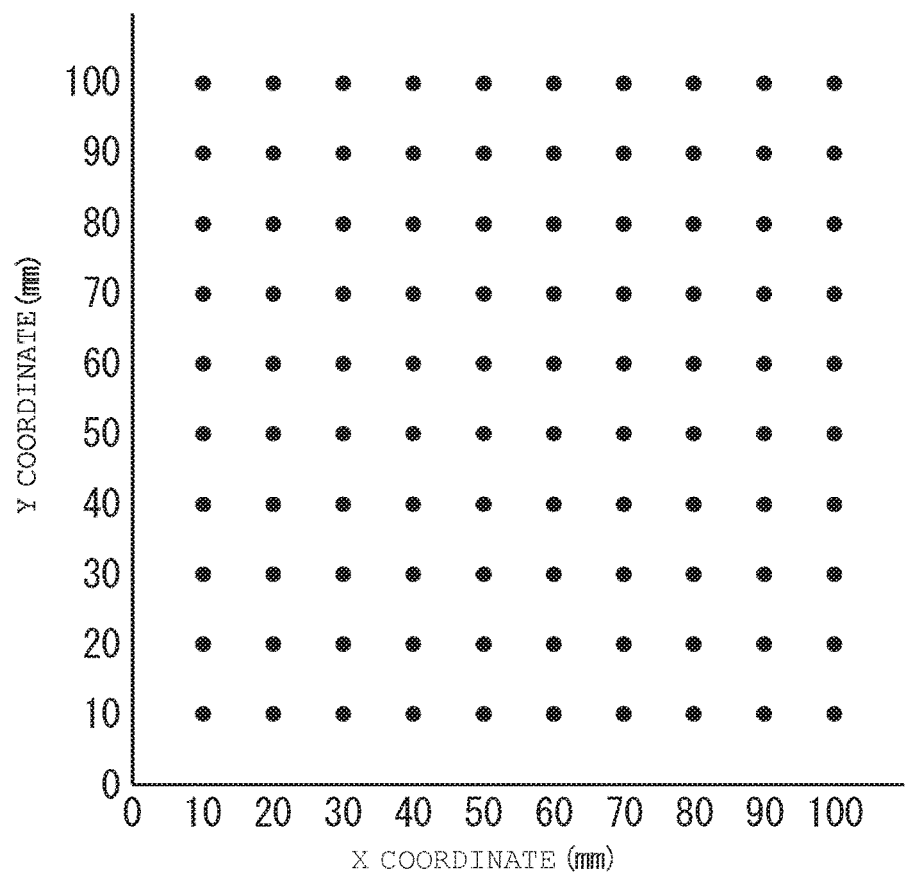
FIG. 7 is a first diagram useful in explaining the area information generating process.

In the area information generating process 70, as depicted in FIG. 7, the processor 8 designates the designated plane described above as an XY orthogonal coordinate system (or "first plane orthogonal coordinate system") and a coordinate value of the Y coordinate (that is, "one coordinate value out of two position coordinates" for the present invention) in this XY orthogonal coordinate system as the designated coordinate value (step 71). Note that the positions of the points depicted in FIG. 7 indicate measurement positions on the designated plane. In this example, as the designated coordinate value, the processor 8 designates 10 mm, which is one out of the Y coordinates (the values 10 mm, 20 mm, 30 mm, 40 mm, 50 mm, 60 mm, 70 mm, 80 mm, 90 mm, and 100 mm in FIG. 7) at which a measurement position is present on the XY orthogonal coordinate system that is the designated plane. After this, as depicted in FIG. 3, the processor 8 defines an Xη orthogonal coordinate system (or "second plane orthogonal coordinate system") that has the X coordinate (the other of the position coordinates in the first plane orthogonal coordinate system) as a first coordinate (the coordinate in the left-right direction in FIG. 8) and the power supplying efficiency η as a second coordinate (the coordinate in the up-down direction in FIG. 8) (step 72).

Figure 8:
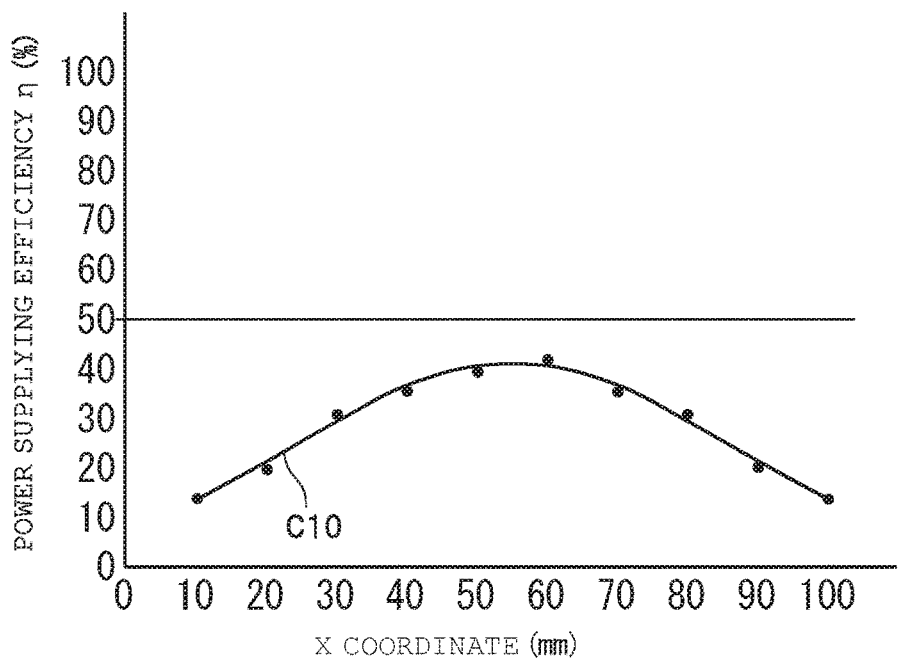
FIG. 8 is a second diagram useful in explaining the area information generating process.

Next, as depicted in FIG. 8, the processor 8 plots coordinate points, which indicate the power supplying efficiency η at each measurement position in the Xη orthogonal coordinate system, in the Xη orthogonal coordinate system (step 73). After this, as depicted in FIG. 8, the processor 8 specifies a curve C10 indicating the relationship between the X coordinates (the other of the position coordinates in the first plane orthogonal coordinate system) and the power supplying efficiency η by approximation or interpolation based on the coordinate points that have been plotted (step 74). Since it is possible to use a variety of known methods for approximation and interpolation, detailed description is omitted here.

Next, the processor 8 determines whether a protrusion that protrudes downward from a designated range (in this example, at least 50%) below a lower limit value of the designated range (in this example, 50%) is present on the curve C10 (step 75). In this example, as depicted in FIG. 8, since a protrusion is not present on the curve C10, the processor 8 determines in step 75 that there is no protrusion and then executes a first specifying process (step 76).

In this first specifying process, as depicted in FIG. 8, the processor 8 specifies an extending length along the X coordinate axis (or "axis of the first coordinates" for the present invention) of the curve C10 where the power supplying efficiency η is at least 50% (that is, where the power supplying efficiency η belongs within the "designated range"). In this example, as depicted in FIG. 8, since the curve C10 does not have a part where the power supplying efficiency η is at least 50% (that is, a part that belongs within the designated range), the processor 8 specifies the extending length of the curve C10 as 0 mm.

Figure 9:
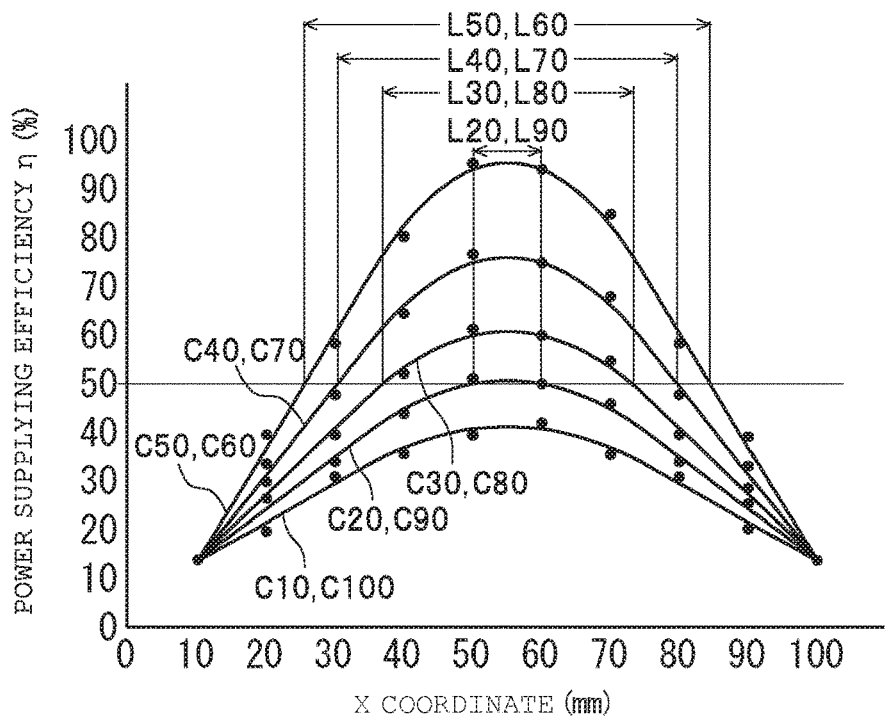
FIG. 9 is a third diagram useful in explaining the area information generating process.

After this, the processor 8 determines whether the first specifying process has been completed for all of the designated coordinate values of the Y coordinate that can be designated (that is, all of the Y coordinates at which measurement positions are present) (step 77). At this point, since the extending length has not been specified for all of the designated coordinate values that can be designated, the processor 8 executes step 71 described above and designates, as the designated coordinate value of the Y coordinate, 20 mm produced by adding 10 mm, which is the movement interval of the supplier-side electrode 101, to the 10 mm value described above which was used in the previous iteration. The processor 8 then executes steps 72 to 77 described above. Hereafter, the processor 8 repeatedly executes the processing in steps 71 to 77 described above (that is, various processes including the first specifying process) while changing the designated coordinate value of the Y coordinate until extending lengths have been specified for all of the designated coordinate values that can be designated in the movement range. By doing so, as depicted in FIG. 9, extending lengths are specified for the curves C10 to C100 (hereinafter collectively referred to as the "curves C" when no distinction is made) for the respective designated coordinate values (10 mm to 100 mm). Note that FIG. 9 illustrates a case where the extending lengths for the curves C10 and C100 are both 0 mm and the extending lengths for the curves C20 to C90 are the extending lengths L20 to L90 (hereinafter collectively referred to as the "extending lengths L" when no distinction is made).

Figure 10:
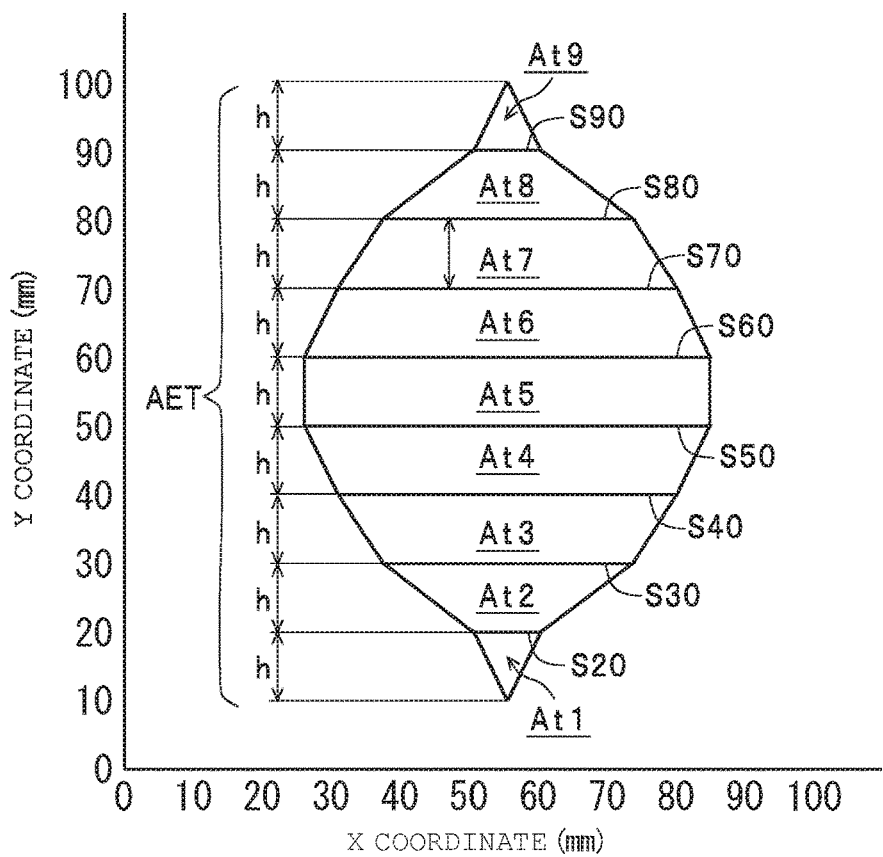
FIG. 10 is a fourth diagram useful in explaining the area information generating process.

After this, on determining in step 77 that the first specifying process has been completed for all of the designated coordinate values that can be designated in the movement range of the supplier-side electrode 101, the processor 8 specifies the active efficient region area AET (step 78). In more detail, as depicted in FIG. 10, in the XY orthogonal coordinate system (or "first plane orthogonal coordinate system"), the processor 8 defines segments S20 to S90

(hereinafter collectively referred to as the "segments S" when no distinction is made) of the extending lengths L20 to L90 of the designated coordinate values that pass through designated coordinate values, out of the respective designated coordinate values (10 mm to 100 mm) of the Y coordinate, whose extending lengths are not 0 mm (that is, the designated coordinate values of 20 mm to 90 mm) and are parallel to the X coordinate axis (or "axis of the other position coordinate"). After this, as depicted in FIG. 10, the processor 8 executes, for every combination of two designated coordinate values, a calculation process which calculates the area of a trapezoid where two segments S that pass through two adjacent designated coordinate values are the upper and lower edges and the distance between the two designated coordinate values is the height h and calculates, when one out of the two adjacent designated coordinate values has an extending length of 0 mm, the area of a triangle that has a segment (in this example, the segments S20 and S90) of the extending length of the other designated coordinate value that passes through the other designated coordinate value (in this example, 20 mm and 90 mm) and is parallel to the X coordinate axis as the base and the distance between the two adjacent designated coordinate values as the height h (in this example, the areas of two triangles (isosceles triangles) that respectively have the segments S20 and S90 as the base are calculated). After this, the processor 8 adds the areas At2 to At8 of the trapezoids and the areas At1 and At9 of the triangles calculated by the calculation process (see FIG. 10, hereinafter when no distinction is made between the areas At1 to At9, these areas are collectively referred to as the "areas At") to specifies the active efficient region area AET (or "region area"). When doing so, if there are no designated coordinate values for which the extending length is 0 mm, the processor 8 does not calculate the area of any triangles in the calculation process described above and only calculates the areas of trapezoids. Note that it is assumed that the expression "trapezoid" used here includes rectangles.

After this, the processor 8 generates the area data Da (or "area information") indicating the specified active efficient region area AET and stores the area data Da in the storage 6 (step 79) to complete the area information generating process 70.

Next, the processor 8 reads the area data Da from the storage 6. As depicted in FIG. 5, the processor 8 then executes the display process and controls the display 7 to display the active efficient region area AET where the power supplying efficiency η is at least 50% on the XY plane where the coordinate in the Z direction is 10 mm inside an area display frame Fa in the area information image Gi. By doing so, the displaying of the area information image Gi that includes the area information is completed.

On the other hand, in step 74 in the area information generating process 70 described above, there are cases where the curve C specified by an approximation formula or an interpolation formula based on the coordinate points plotted in an Xη orthogonal coordinate system has a wave-like shape that fluctuates in the up-down direction as depicted in FIG. 13. In this situation, as depicted in FIG. 13, the curve C includes a protrusion P that protrudes downward from the designated range below the lower limit value of the designated range (in this example, 50%). When the protruding length Lp of the protrusion P is short, there is a high probability that the protrusion P was produced when specifying the curve C due to the characteristics of the approximation formula or interpolation formula used to specify the curve C and therefore a high probability that the actual power supplying efficiency η is actually within the designated range. For this reason, when a protrusion P is present on the curve C, in the first specifying process in step 76 described above, there is the risk of the extending length L being specified as being shorter than the actual length, which results in the active efficient region area AET being specified as smaller than the actual area. To avoid this, the measuring apparatus 1 is configured so that in step 75 described above, on determining that a protrusion that protrudes downward below the lower limit value of the designated range is present on the curve C, the processor 8 executes a second specifying process in place of the first specifying process described above (step 80).

In the second specifying process, the processor 8 specifies the protruding length Lp of the protrusion P (protruding amount, see FIG. 13) and specifies a maximum length Lm (see FIG. 13) that corresponds to the difference between the highest and lowest values of the power supplying efficiency η of the curve C. When the ratio of the protruding length Lp to the maximum length Lm is in a range that is above 0% but no greater than 3% (one example of a range set in advance), the processor 8 specifies the extending length L described above with the protrusion P regarded as belonging within the designated range. Since the processor 8 executes the second specifying process on determining that a protrusion that protrudes downward below the lower limit value of the designated range is present on the curve C, the measuring apparatus 1 is capable of accurately specifying the active efficient region area AET.

The measuring apparatus 1 is capable of identifying the active efficient region area AET for each of a plurality of different designated ranges, generating area information (the area data Da) indicating each active efficient region area AET, and displaying area information images Gi indicating the respective area information. To have area information generated and an area information image Gi indicating the area information displayed, as depicted in FIG. 11, a value (for example, "70") designating the coordinate (70 mm) in the Z direction of the measurement position is inputted at two input positions in the setting value input frame Fi3 in the area information image Gi. Here, a plane that is parallel to the X and Y directions at the designated Z direction coordinate (in this example, 70 mm) is designated as the designated plane. After this, a plurality of designated ranges are designated. The measuring apparatus 1 is configured so that the upper limit value and lower limit value of the power supplying efficiency η of the first designated range are specified and a plurality of designated ranges are then automatically designated by leaving the upper limit values of the second and following designated ranges unchanged and increasing the respective lower limit values by a designated increment. To do so, as depicted in FIG. 11, "10%" and "100%", for example, are inputted in the setting value input frame Fi4 in the area information image Gi as the lower limit value and upper limit value of the first designated range. After this, as depicted in FIG. 11, "10%" for example is inputted into the setting value input frame Fi5 in the area information image Gi as the increment. By doing so, ten designated ranges where the lower limit value is set as 10%, 20%, 30%, . . . , 100% and the upper limit value is set at 100% are automatically designated.

Next, the EXECUTE key K2 is operated. In response to this, the processor 8 executes the area information generating process 70 described above (see FIG. 6). When doing so, in the area information generating process 70, the processor 8 first executes steps 71 to 79 with 10% designated as the lower limit value of the designated range and 100% designated as the upper limit value. The processor 8 then increases the lower limit value of the designated range by 10% (the "increment" described above) and executes steps 71 to 79 with 20% designated as the lower limit value and 100% designated as the upper limit value. The processor 8 thereafter executes steps 71 to 79 while increasing the lower limit value of the designated range by 10% each time until the lower limit value has been raised to 90% and then ends the area information generating process 70.

After this, the processor 8 reads out the area data Da from the storage 6. Based on the area data Da, the processor 8 then displays an area graph Gg in the area information image Gi as depicted in FIG. 11. As one example, the area graph Gg displayed here displays the relationship between each designated range and the active efficient region area AET in an orthogonal coordinate system that has the power supplying efficiency η of the lower limit value of the designated range as the horizontal axis and has an active efficient region area AET, where measured values belong in a designated range that has the power supplying efficiency η as the lower limit value and 100% as the upper limit value as the vertical axis. This means that it is possible to grasp the difference in active efficient region area AET between a plurality of designated ranges at a single glance from the area graph Gg. By operating as described above, the displaying, by way of an area graph Gg, of the area information image Gi indicating the active efficient region area AET of each of a plurality of designated ranges as area information is completed.

The measuring apparatus 1 is also capable of specifying the active efficient region area AET on a plurality of designated planes that are parallel and have respectively different Z direction coordinates, generating area information (the area data Da) indicating the active efficient region areas AET, and displaying an area information image Gi indicating such area information. To have an active efficient region area AET generated as area information for each of the plurality of designated ranges described above and an area information image Gi indicating such area information displayed using this function, as depicted in FIG. 12, 10 mm to 80 mm for example is inputted into the setting value input frame Fi3 in the area information image Gi as the range of Z direction coordinates for the measurement positions. Here, as one example, when measurement has been performed at the measurement positions where the Z direction coordinate is 70 mm, 50 mm, and 10 mm out of the inputted range of Z direction coordinates, three planes that are parallel to the X and Y directions and whose Z direction coordinates are 70 mm, 50 mm, and 10 mm are designated as the designated planes for which area information is to be generated. As examples, "10%" and "100%" are inputted into the setting value input frame Fi4 in the area information image Gi as the lower limit value and upper limit value of the designated ranges, "10%" for example is inputted as the increment into the setting value input frame Fi5 in the area information image Gi, and then the EXECUTE key K2 is operated. In response to this, the processor 8 executes the area information generating process 70 described above (see FIG. 6).

Here, in the area information generating process 70, the processor 8 first designates, for the designated plane where the Z direction coordinate is 10 mm, the lower limit value of the designated range so as to increase by 10% at a time starting from 10% and executes the processing in steps 71 to 79 described above for the designated lower limit value until the lower limit value has been increased to 90%. The processor 8 then performs the same processing for the designated plane where the Z direction coordinate is 50 mm and ends the area information generating process 70 after performing the same processing for the designated plane where the Z direction coordinate is 70 mm.

After this, the processor 8 reads out the area data Da from the storage 6. Based on the area data Da, as depicted in FIG. 12, the processor 8 then displays an area graph Gg distinguishably (in the present example, with different lines), which indicates how the active efficient region area AET changes in keeping with changes in the designated range in the three designated planes, inside the area information image Gi. By doing so, displaying of the area information image Gi indicating the active efficient region area AET for each of a plurality of designated ranges on the three designated planes as the area information is completed.

In this way, the measuring apparatus 1 specifies the active efficient region area AET of a region on a designated plane on which the supplier-side electrode 101 moves where the power supplying efficiency η is within the designated range, and generates the area data Da (area information) indicating the active efficient region area AET. This means that according to the measuring apparatus 1, as one example, by designating a designated range that has the minimum power supplying efficiency required for a noncontact power supply as a lower limit value and generating area data Da indicating the active efficient region area AET within the designated range that has been designated, it is possible to determine, based on the area data Da, whether the active efficient region area AET required for an noncontact power supply is large or small, and by doing so, to accurately evaluate a noncontact power supply.

According to the measuring apparatus 1, the coordinate value of the Y coordinate in an XY orthogonal coordinate system is designated as the designated coordinate value, coordinate points defined by a coordinate value of the X coordinate of measurement positions where the coordinate value of the Y coordinate is the designated coordinate value and the power supplying efficiency η at that measurement position are plotted in an Xη orthogonal coordinate system that has the X coordinate as the first coordinate and has the power supplying efficiency η as the second coordinate, a curve C indicating the relationship between the X coordinate and the power supplying efficiency η is specified based on these coordinate points, and a specifying process that specifies the extending length L along the X coordinate axis of the curve C belonging inside the designated range is executed while changing the designated coordinate value. By specifying the active efficient region area AET based on the extending lengths L specified by the respective specifying processes, it is possible to accurately specify the active efficient region area AET using simple processing.

According to the measuring apparatus 1, a calculation process which calculates, for every combination of two designated coordinate values, the area At of a trapezoid having two segments S, which pass through two adjacent designated coordinate values in the XY orthogonal coordinate system, are parallel to the X coordinate axis, and have the extending lengths L at respective designated coordinate values, as the upper and lower edges and the distance between the two designated coordinate values as the height and calculates, when the extending length of one out of the two adjacent designated coordinate values is zero, the area At of a triangle that has a segment, which passes through the other designated coordinate value, is parallel to the X coordinate axis, and has the extending length at the other designated coordinate value, as the base and the distance between the two adjacent designated coordinate values as the height, and then adds the areas At calculated by the calculation process to specify the active efficient region area AET. Compared to an example method that specifies the active efficient region area AET by executing, for every segment S, a process that calculates the area of rectangles that have the segments S as the long sides and the segments of a distance between two adjacent designated coordinate values as the short sides and adds the areas of the respective rectangles, it is possible to specify the active efficient region area AET more accurately.

According to the measuring apparatus 1, when a protrusion P that protrudes downward from the designated range below the lower limit value of the designated range is present on a curve C that has been specified by approximation or interpolation based on the coordinate points, if the protruding length Lp of the protrusion P is within a range that has been set in advance, the extending length L is specified by regarding the protrusion P as belonging within the designated range. This means that according to the measuring apparatus 1, it is possible to reliably avoid a situation where the active efficient region area AET is specified as being smaller than the actual area due to a protrusion P of the curve C that has a high probability of having been produced when the curve C was specified using an approximation formula or an interpolation formula being treated as being outside the designated range. As a result, it is possible to specify the active efficient region area AET even more accurately.

Also, according to the measuring apparatus 1, since is possible, by specifying the active efficient region area AET for each of a plurality of different designated ranges and generating area data Da indicating the active efficient region areas AET, to display an area graph Gg indicating how the active efficient region area AET changes according to changes in the designated range based on the area data Da, it is possible to grasp the active efficient region area AET for each of a plurality of designated ranges at a glance. This means that it is possible to significantly improve usability when evaluating a noncontact power supply.

According to the measuring apparatus 1, by generating the area data Da that indicates the active efficient region area AET on a plurality of planes that are parallel, it is possible to grasp changes in the active efficient region area AET caused by changes in the separation distance between the supplier-side electrode 101 and the receiver-side electrode 102. Therefore, according to the measuring apparatus 1, it is possible to evaluate the noncontact power supply from multiple viewpoints.

The measuring apparatus 1 is equipped with the display 7 and the processor 8 displays the area information image Gi indicating the active efficient region area AET on the display 7 based on the area data Da. Unlike a configuration that is not equipped with the display 7 and displays the area information image Gi on an external display, a task of connecting the measuring apparatus 1 to the external display is unnecessary, which improves the efficiency of the task of evaluating a noncontact power supply based on the area information image Gi.

Note that the measuring apparatus according to the present invention is not limited to the configuration described above. As one example, although an example that designates, as the designated coordinate value, the coordinate value of the Y coordinates as one of the X coordinates and Y coordinates in the XY orthogonal coordinate system as the first plane orthogonal coordinate system and defines, as the second plane orthogonal coordinate system, an X$\eta$ orthogonal coordinate system that has the X coordinates as the other out of the X coordinates and the Y coordinates as a first coordinate and the power supplying efficiency $\eta$ as a second coordinate has been described above, it is also possible to use a configuration that designates, as the designated coordinate value, the coordinate value of the X coordinates as one of the X coordinates and Y coordinates and defines, as the second plane orthogonal coordinate system, a Y$\eta$ orthogonal coordinate system that has the Y coordinates as the other coordinates as a first coordinate and the power supplying efficiency $\eta$ as a second coordinate.

Also, although an example that specifies the active efficient region area AET by adding the areas At of a plurality of trapezoids that have two segments S that pass two adjacent designated coordinate values and are parallel to the X coordinate axis as upper and lower edges has been described above, it is also possible to specify the active efficient region area AET according to another method. As one example, it is also possible to use a configuration that executes, for every segment S, a process that calculates the area of a rectangle that has the segment S as the long sides and has segments of the distance between two adjacent designated coordinate values as the short sides and specifies the active efficient region area AET by adding the areas of the rectangles.

Also, although an example configuration where the mover 23 moves the supplier-side holder 21 that holds the supplier-side electrode 101 of a noncontact power supply has been described above, it is also possible to use a configuration where the mover 23 moves the receiver-side holder 22 that holds the receiver-side electrode 102 of a noncontact power supply. It is also possible to use a configuration where the mover 23 moves both the supplier-side holder 21 that holds the supplier-side electrode 101 and the receiver-side holder 22 that holds the receiver-side electrode 102.

Also, although an example where area information is generated by making measurements of a noncontact power supply used when charging the battery of an electrical appliance and an area information image Gi indicating the area information is displayed has been described above, the noncontact power supply to be measured is not limited to this. As one example, it is also possible to evaluate a noncontact power supply used when charging the battery of an electric vehicle.

Although an example configuration that is equipped with the display 7 and displays the area information image Gi (area information) on the display 7 has been described above, it is also possible to use a configuration that displays the area information image Gi on an external display. It is also possible to apply the present invention to a measuring apparatus that does not have a function for displaying the area information image Gi and simply generates the area data Da (area information).

Moreover, the invention encompasses any possible combination of some or all of the various embodiments and the modification examples described herein and incorporated herein.

It is possible to achieve at least the following configurations from the above-described example embodiments and the modification examples of the disclosure.

(1) A measuring apparatus comprising:

a mover that moves at least one of a supplier electrode and a receiver electrode of a noncontact power supply to measurement positions that have been decided in advance;

a meter that measures a measurement for the noncontact power supply at each measurement position; and a processor that calculates a power supplying efficiency of the noncontact power supply at each measurement position based on measured values of the measurement, wherein the processor specifies, on a plane where the at least one of the supplier electrode and the receiver electrode moves, a region area of a region where the power supplying efficiency is in a designated range that has been designated in advance, and generates area information indicating the region area.

(2) The measuring apparatus according to (1), wherein the processor treats the plane as a first plane orthogonal coordinate system, designates one coordinate value out of two position coordinates in the first plane orthogonal coordinate system as a designated coordinate value, defines a second plane orthogonal coordinate system that has another coordinate value out of the two position coordinates as a first coordinate and has the power supplying efficiency as a second coordinate, plots, in the second plane orthogonal coordinate system, coordinate points that are each defined by a coordinate value of the other position coordinate of a measurement position where the one coordinate value out of the two position coordinates is the designated coordinate value and the power supplying efficiency of the measurement position, specifies a curve indicating a relationship between the other position coordinate and the power supplying efficiency based on the coordinate points, executes, while changing the designated coordinate value, a specifying process that specifies an extending length, along an axis of the first coordinates, of the curve that belongs inside the designated range, and specifies the region area based on the extending lengths specified by the specifying process.

(3) The measuring apparatus according to (2), wherein the processor executes, for every combination of two designated coordinate values, a calculation process that calculates an area of a trapezoid having two segments, which pass through two adjacent designated coordinate values in the first plane orthogonal coordinate system, are parallel to an axis of the other position coordinate, and have the respective extending lengths at the designated coordinate values, as upper and lower edges and a distance between the two designated coordinate values as a height and calculates, when the extending length of one out of the two adjacent designated coordinate values is zero, an area of a triangle that has a segment, which passes through the other designated coordinate value, is parallel to an axis of the other position coordinate, and has the extending length at the other designated coordinate value, as a base and a distance between the two adjacent designated coordinate values as a height, and adds the areas calculated in the calculation process to specify the region area.

(4) The measuring apparatus according to (2) or (3), wherein the processor specifies the curve based on the coordinate points using approximation or interpolation and specifies the extending length in the specifying process by regarding, when a protrusion that protrudes downward from the designated range below a lower limit value of the designated range is present on the curve and a protruding amount of the protrusion is within a range set in advance, the protrusion as belonging within the designated range.

(5) The measuring apparatus according to any one of (1) to (4), wherein the processor specifies a region area for each of a plurality of different designated ranges and generates information indicating each region area as the area information.

(6) The measuring apparatus according to any one of (1) to (5), wherein the processor specifies region areas on a plurality of planes that are respectively parallel and generates information indicating each region area as the area information.

(7) The measuring apparatus according to any one of (1) to (6), further comprising a display and a display controller that displays, based on the area information, an image indicating the region area on the display.

What is claimed is:

1. A measuring apparatus comprising:

a mover that moves at least one of a supplier electrode and a receiver electrode of a noncontact power supply to measurement positions that have been decided in advance;

a meter that measures a measurement for the noncontact power supply at each measurement position; and a processor that calculates a power supplying efficiency of the noncontact power supply at each measurement position based on measured values of the measurement, wherein when the processor specifies, on a plane where the at least one of the supplier electrode and the receiver electrode moves, a region area of a region where the power supplying efficiency is in a designated range that has been designated in advance, and generates area information indicating the region area, the processor:

treats the plane as a first plane orthogonal coordinate system, designates one coordinate value out of two position coordinates in the first plane orthogonal coordinate system as a designated coordinate value, defines a second plane orthogonal coordinate system that has another coordinate value out of the two position coordinates as a first coordinate and has the power supplying efficiency as a second coordinate, plots, in the second plane orthogonal coordinate system, coordinate points that are each defined by a coordinate value of the other position coordinate of a measurement position where the one coordinate value out of the two position coordinates is the designated coordinate value and the power supplying efficiency of the measurement position, specifies a curve indicating a relationship between the other position coordinate and the power supplying efficiency based on the coordinate points, executes, while changing the designated coordinate value, a specifying process that specifies an extending length, along an axis of the first coordinates, of the curve that belongs inside the designated range, and specifies the region area based on the extending lengths specified by the specifying process.

2. The measuring apparatus according to claim 1, wherein the processor executes, for every combination of two designated coordinate values, a calculation process that calculates an area of a trapezoid having two segments, which pass through two adjacent designated coordinate values in the first plane orthogonal coordinate system, are parallel to an axis of the other position coordinate, and have the respective extending lengths at the designated coordinate values, as upper and lower edges and a distance between the two designated coordinate values as a height and calculates, when the extending length of one out of the two adjacent designated coordinate values is zero, an area of a triangle that has a segment, which passes through the other designated coordinate value, is parallel to an axis of the other position coordinate, and has the extending length at the other designated coordinate value, as a base and a distance between the two adjacent designated coordinate values as a height, and adds the areas calculated in the calculation process to specify the region area.

3. The measuring apparatus according to claim 1,
wherein the processor specifies the curve based on the coordinate points using approximation or interpolation and specifies the extending length in the specifying process by regarding, when a protrusion that protrudes downward from the designated range below a lower limit value of the designated range is present on the curve and a protruding amount of the protrusion is within a range set in advance, the protrusion as belonging within the designated range.

4. The measuring apparatus according to claim 2,
wherein the processor specifies the curve based on the coordinate points using approximation or interpolation and specifies the extending length in the specifying process by regarding, when a protrusion that protrudes downward from the designated range below a lower limit value of the designated range is present on the curve and a protruding amount of the protrusion is within a range set in advance, the protrusion as belonging within the designated range.

5. The measuring apparatus according to claim 1,
wherein the processor specifies a region area for each of a plurality of different designated ranges and generates information indicating each region area as the area information.

6. The measuring apparatus according to claim 2,
wherein the processor specifies a region area for each of a plurality of different designated ranges and generates information indicating each region area as the area information.

7. The measuring apparatus according to claim 3,
wherein the processor specifies a region area for each of a plurality of different designated ranges and generates information indicating each region area as the area information.

8. The measuring apparatus according to claim 4,
wherein the processor specifies a region area for each of a plurality of different designated ranges and generates information indicating each region area as the area information.

9. The measuring apparatus according to claim 1,
wherein the processor specifies region areas on a plurality of planes that are respectively parallel and generates information indicating each region area as the area information.

10. The measuring apparatus according to claim 2,
wherein the processor specifies region areas on a plurality of planes that are respectively parallel and generates information indicating each region area as the area information.

11. The measuring apparatus according to claim 3,
wherein the processor specifies region areas on a plurality of planes that are respectively parallel and generates information indicating each region area as the area information.

12. The measuring apparatus according to claim 4,
wherein the processor specifies region areas on a plurality of planes that are respectively parallel and generates information indicating each region area as the area information.

13. The measuring apparatus according to claim 5,
wherein the processor specifies region areas on a plurality of planes that are respectively parallel and generates information indicating each region area as the area information.

14. The measuring apparatus according to claim 6,
wherein the processor specifies region areas on a plurality of planes that are respectively parallel and generates information indicating each region area as the area information.

15. The measuring apparatus according to claim 7,
wherein the processor specifies region areas on a plurality of planes that are respectively parallel and generates information indicating each region area as the area information.

16. The measuring apparatus according to claim 8,
wherein the processor specifies region areas on a plurality of planes that are respectively parallel and generates information indicating each region area as the area information.

17. The measuring apparatus according to claim 1,
further comprising a display and a display controller that displays, based on the area information, an image indicating the region area on the display.

* * * * *